(12) United States Patent
Dieckmann et al.

(10) Patent No.: US 8,488,104 B2
(45) Date of Patent: Jul. 16, 2013

(54) PROJECTION OBJECTIVE WITH DIAPHRAGMS

(75) Inventors: Nils Dieckmann, Huettlingen (DE);
Alexander Wolf, Oberkochen (DE);
Christian Holland, Aalen (DE); Ulrich Loering, Schwaebisch Gmuend (DE);
Franz Sorg, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 313 days.

(21) Appl. No.: 13/107,011

(22) Filed: May 13, 2011

(65) Prior Publication Data

US 2011/0285979 A1 Nov. 24, 2011

(30) Foreign Application Priority Data

May 19, 2010 (DE) .......................... 10 2010 021 539

(51) Int. Cl.
*G03B 27/72* (2006.01)
*G03B 27/54* (2006.01)

(52) U.S. Cl.
USPC .............................................. 355/71; 355/67

(58) Field of Classification Search
USPC .................... 355/53, 67–71; 359/733
See application file for complete search history.

(56) References Cited

U.S. PATENT DOCUMENTS

| 4,733,945 | A | 3/1988 | Bacich |
| 6,097,536 | A | 8/2000 | Bauer et al. |
| 6,717,746 | B2 | 4/2004 | Epple et al. |
| 6,831,282 | B2 * | 12/2004 | Yahiro .................. 250/492.22 |
| 7,081,278 | B2 | 7/2006 | Lipson et al. |
| 7,715,016 | B2 * | 5/2010 | Hwang et al. ............ 356/498 |
| 7,781,029 | B2 * | 8/2010 | Lipson et al. ............ 427/553 |
| 2002/0163741 | A1 | 11/2002 | Shibazaki |
| 2003/0234918 | A1 | 12/2003 | Watson |
| 2007/0165202 | A1 | 7/2007 | Koehler et al. |
| 2009/0115986 | A1 * | 5/2009 | Feldmann et al. ............ 355/66 |

FOREIGN PATENT DOCUMENTS

| WO | WO 2004/019128 | 3/2004 |
| WO | WO 2005/026843 | 3/2005 |
| WO | WO 2005/111689 | 11/2005 |
| WO | WO 2006/128613 | 12/2006 |

OTHER PUBLICATIONS

German Examination Report, with English translation, for corresponding DE Appl No. 10 2010 021 539.2, dated Oct. 7, 2010.

* cited by examiner

*Primary Examiner* — Hung Henry Nguyen
(74) *Attorney, Agent, or Firm* — Fish & Richardson P.C.

(57) ABSTRACT

A projection objective for imaging an object arranged in an object plane of the projection objective into an image of the object lying in an image plane of the projection objective has a multiplicity of transparent optical elements and holding devices for holding the optical elements at prescribable positions along an imaging beam path of the projection objective. Each of the optical elements has an optical useful region lying in the imaging beam path and an edge region lying outside the optical useful region. At least one holding element of the holding device assigned to the optical element acts at the edge region in the region of a contact zone. At least one of the optical elements is assigned a diaphragm arrangement with a false light diaphragm arranged directly upstream of the optical element and a second false light diaphragm arranged directly downstream of the optical element. Each of the false light diaphragms is fashioned in such a way that the false light diaphragm screens at least a part of the edge region against radiation running outside the imaging beam path.

20 Claims, 5 Drawing Sheets

PROJECTION OBJECTIVE WITH DIAPHRAGMS

CROSS-REFERENCE TO RELATED APPLICATION

This application claims benefit under 35 U.S.C. §119 of German patent application serial number 10 2010 021 539.2, filed May 19, 2010, the entire contents of which are hereby incorporated by reference.

FIELD

The disclosure relates to a projection objective for imaging an object arranged in an object plane of the projective objective, into an image of the object lying in an image plane of the projection objective. The projection objective can be implemented in a microlithographic projection exposure machine. In such an implementation, the projection objective is an optical imaging system which images a pattern of a mask arranged in its object plane onto a light-sensitive substrate arranged in the image plane of the projection objective.

BACKGROUND

It is currently predominantly microlithographic projection exposure methods which are used to produce semiconductor components and other finely structured components. In this case, use is made of masks (reticles) which carry or form the pattern of a structure to be imaged, for example, a line pattern of a layer of a semiconductor component. A mask is positioned in a projection exposure machine between an illumination system and a projection objective in the region of the object surface of the projection objective, and illuminated in the region of an effective object field with the aid of an illuminating radiation provided by the illumination system. The radiation varied by the mask and the pattern passes as an imaging beam through the imaging beam path of the projection objective, which images the pattern of the mask in the region of the effective image field optically conjugate to the effective object field onto the substrate to be exposed. The substrate normally carries a layer (photoresist), sensitive to the projection radiation. One of the aims in the development of projection exposure machines is to lithographically produce structures with increasingly smaller dimensions on the substrate. Relatively small structures lead to relatively high integration densities in the case of semiconductor components, for example, and this generally has an advantageous effect on the performance of the microstructured components produced. The size of the structures which can be produced depends on the resolving power of the projection objective used, and can be increased, on the one hand, by reducing the wavelength of the projection radiation used for the projection and, on the other hand, by increasing the image-side numerical aperture NA of the projection objective which is used in the process.

It is predominantly purely refractive projection objectives which have been used in the past for optical lithography. In the case of a purely refractive or dioptric projection objective, all the optical elements which have the refractive power are transparent refractive elements (lenses). In the case of dioptric systems, it becomes more difficult with rising numerical aperture and falling wavelength to correct elementary aberrations such as, for example, to correct chromatic aberrations and to correct the image field curvature.

One approach to attaining a flat image surface and a good correction of chromatic aberrations is to use catadioptric projection objectives which include both refractive transparent optical elements with refractive power, that is to say lenses, and reflective elements with refractive power, that is to say curved mirrors. At least one concave mirror is typically included. The contributions of lenses with positive refractive power and lenses with negative refractive power in an optical system are respectively opposed to the total refractive power, the image field curvature and the chromatic aberrations. However, just like a positive lens, a concave mirror has a positive refractive power, but a concave mirror has an effect on the image field curvature inverse to a positive lens. Moreover, concave mirrors do not introduce any chromatic aberrations.

As a rule, projection objectives have a multiplicity of transparent optical elements, in particular positive lenses and negative lenses, in order to enable partially opposite properties with regard to the correction of aberrations even given the use of large numerical apertures. Both refractive and catadioptric imaging systems in the field of microlithography frequently have ten or more transparent optical elements.

The optical elements are held with the aid of holding devices at defined positions along an imaging beam path. In the field of optical systems for microlithography, very complex technologies have been developed in this case for the design of holding devices in order to ensure a high imaging quality of the imaging system by exact positioning of the held optical elements in the imaging beam path in conjunction with different operating conditions and in order to ensure that the expensive and sensitive optical elements are held without stress in as gentle a manner as possible. In the field of microlithography, lenses and other transparent optical elements are frequently supported via a multiplicity of holding elements which are arranged uniformly on the circumference of the respective optical element. In this case, the optical element has an optical useful region lying in the imaging beam path, and an edge region lying outside the optical useful region. One or more holding elements of the holding device are assigned to the optical element acting on the edge region in the region of a contact zone. The surfaces of the optical element are prepared with optical quality in the optical useful region, whereas the optical quality need not be reached in the edge region. The optical useful region is frequently also denoted as the "free optical diameter" of the optical element.

Different options have already been proposed for fixing the optical element on the holding elements. Patent application US 2003/0234918 A1 exhibits examples of clamping technology in which an optical element is held in the edge region of elastomeric holding elements which clamp the optical element in the region of a respective contact zone in the edge region and permit overall a certain mobility for the optical element being held (soft mount). With other holding devices, elastic holding elements of a holding device are bonded to the optical elements in the region of the respectively assigned contact zone. Examples of the bonding technology are shown in U.S. Pat. No. 4,733,945 or U.S. Pat. No. 6,097,536.

In addition to the intrinsic aberrations which a projection objective can have owing to its optical design and its production, aberrations can also occur during the service life, for example during operation of a projection exposure machine. Such aberrations frequently find their cause in changes to the optical elements installed in the projection objective resulting from the projection radiation used during operation. For example, this projection radiation can be partially absorbed by the optical elements in the projection objective, the extent of the absorption depending, among other things, on the material used for the optical elements, for example the lens material, the mirror material and/or the properties of antireflection coating possibly provided, or reflective coatings. The absorption of the projection radiation can lead to heating of the optical elements and this can result, directly and indirectly, in surface deformation of the optical elements and, in the case of refractive elements, a change in refractive index via thermally caused mechanical stresses. Changes in refractive index and surface deformations lead, in time, to changes in the imaging properties of the individual optical elements, and thus also in the projection objective overall. This range of problems is frequently treated under the heading of "lens heating".

An attempt is usually made to compensate thermally induced aberrations or other aberrations occurring during service life at least partially by using active manipulators. As a rule, active manipulators are optomechanical devices which are set up to influence individual optical elements or groups of optical elements on the basis of corresponding control signals, in order to change their optical action so that an aberration which occurs is at least partially compensated. By way of example, it can be provided for this purpose that individual optical elements or groups of optical elements are deformed, or their positions are changed.

Such active manipulators are frequently integrated in the mounting technology, that is to say in the holding device. Relating to this, for example, US 2002/0163741 A1 shows a holding device for a transparent optical element designed as a lens. The holding device has an inner hexapod structure which passively couples an inner ring to the lens, and an outer hexapod structure which functions as a controllable manipulator. Fitted on the inner ring are three clamping devices which are uniformly distributed within the circumference and act in a clamping fashion on the edge of the lens and fix the latter in the inner ring.

In practice, with optical imaging systems of complex design, not only does the radiation pass from the object into the image plane through the imaging beam path desired for the imaging, but it is also possible for radiation components to be produced which not only contribute to the imaging, but disturb and/or impair the imaging. For example, in the course of projection exposure methods so called "over-apertured light" can pass through the substrate to be exposed, for example, a semiconductor wafer, and disturb individual wavefronts. The term "over-apertured light" or "superaperture radiation" here denotes radiation which is diffracted by the structuring mask and emitted at an angle which is larger than the object-side aperture angle used for the imaging and is determined by the current diameter of the aperture stop limiting the imaging beam path. For reasons of production technology, such over-apertured light can nevertheless fall onto the image plane of the imaging system through the aperture stop. Since, as a rule, the imaging of the optics is not designed, and correspondingly not completely corrected, for apertures larger than a maximum usable aperture, this can severely disturb the wavefront contributing to the imaging, and so the imaging quality can be impaired by over-apertured light. Alternatively, or in addition, it is also possible for scattered light to be produced which generally impairs the contrast of the image produced when it passes as far as into the image plane. The term "scattered light" denotes here, among other things, radiation which can, for example, result from residual reflections at the surfaces, coated with antireflection layers, of transparent optical elements, on the rear sides of mirrors and/or at other points in the region of the imaging beam path. These undesired radiation components, in particular, the scattered light and the over-apertured light, are also denoted as "false light" in the context of this application irrespective of their cause.

False light which does not reach the region of the image field in the image plane and thereby does not directly disturb the imaging can nevertheless disadvantageously affect the quality of an imaging process when it impinges on points of the system not provided for the irradiation and is possibly absorbed there. False light can, for example, be absorbed in parts of the mounting of the optical imaging system and generate heat which reacts to affect the position and/or shape of the optical elements via corresponding thermal expansion of affected components. False light can also be absorbed by parts of the imaging system which consist neither of a transparent optical material nor of metal. Examples of this are cables, sensors and/or actuators of manipulator devices which can include plastic parts which outgas when irradiated. This outgassing is generally undesired, since not only can the functioning of these parts be impaired thereby, but also because the atmosphere inside the imaging beam path can be influenced.

It is known for optical imaging systems of complex design, such as projection objectives for microlithography for example, to be equipped with one or more baffle plate plates in order to reduce the negative effects of scattered light on the imaging. For example, patent U.S. Pat. No. 6,717,746 B2 gives exemplary embodiments of catadioptric projection objectives in which a baffle plate for reducing scattered or false light can be inserted in the region of a real intermediate image formed between the object plane and image plane. The international patent application with publication number WO 2006/128613 A1 shows examples of catadioptric projection objectives with a first objective part for imaging an object in a first real intermediate image, a second objective part for producing a second real intermediate image with the aid of the radiation coming from the first objective part, a third objective part for imaging the second real intermediate image in the image plane, and a radiation directing device which ensures that the radiation in the second objective part runs in another direction than in the first and third objective parts. At least one diaphragm is arranged in the region of the beam deflection device such that that a radiation component which would run in a fashion bypassing the second objective part directly from the first objective part to the third objective part is effectively reduced by screening. In this way, what passes into the image plane is predominantly or exclusively radiation which uses the entire imaging beam path with all the optical components provided therein and can, correspondingly, contribute to the imaging with a well corrected wavefront.

SUMMARY

The disclosure provides a projection objective that includes a multiplicity of transparent optical elements and that exhibits relatively reduced disadvantageous influences of false light. The disclosure also provides a projection exposure machine which exhibits such properties.

In the case of a projection objective of generic design in accordance with the disclosure, at least one of the transparent optical elements is assigned a diaphragm arrangement with a false light diaphragm arranged directly upstream of the optical element, and a second false light diaphragm arranged directly downstream of the optical element, each of the false light diaphragms being fashioned in such a way that the false light diaphragm screens at least a part of the edge region against radiation running outside the imaging beam path.

In the screened regions it therefore follows that false light is unable to strike the edge region of the optical element and, if appropriate, holding elements of the holding device with the aid of which the optical element is held in its position or can strike only to a greatly reduced extent. The first false light diaphragm arranged directly upstream of the optical element in this case screens that false light which comes from a light entry side of the optical element with reference to a transmission direction. The second false light diaphragm is located downstream of the optical element with reference to the transmission direction, that is to say on the corresponding light exit side of the optical element. The rear, second false light diaphragm also screens the edge region against radiation which can, for example, result from reflections at light entry sides of subsequent optical elements, and/or by reflections at elements of subsequent holding devices.

The term "directly" signifies in this context that in each case no further optical element is located between the false light diaphragm and that surface of the optical element which faces the diaphragm. False light diaphragms can in this way be fitted very near the optical elements to be protected, thus enabling false light to be screened in a spatially well-defined fashion. However, it is also possible for there to be located between a false light diaphragm and that surface of the optical element facing it, parts of the holding device, in particular parts of holding elements, act thereon in the edge region of the optical element. The parts of the holding device lying between the false light diaphragm and the facing surface of the optical element can also be screened against false light by the appropriate false light diaphragm.

In some embodiments, a false light diaphragm has an inner diaphragm edge defining a diaphragm opening, and a finite spacing between this diaphragm edge and the associated optical surface of the optical element is at most 5 mm, such as less than 2 mm (e.g., less than 1 mm). It is thereby possible to achieve a screening effect defined very effectively in space in conjunction with an adequate protective effect for the screened regions. A minimum spacing of from approximately $1/10$ mm up to approximately $2/10$ mm is advantageous in order at the same time to ensure avoidance of physical contact between the diaphragm edge and optical element in the case of all operating conditions.

In order, furthermore, to ensure at the same time that, if appropriate, elements of the holding device which lie between the false light diaphragm and the assigned optical surface are likewise screened, a false light diaphragm can have an outer, flat edge section, to which there is connected towards the diaphragm edge an inner section which runs obliquely relative to the optical element and defines the diaphragm edge. The inner section can be conically shaped or be in the shape of a conical frustum, for example. The spacing between the optical surface and the false light diaphragm increases very strongly radially outwards, starting from the diaphragm edge, in the case of such configurations, and so any possible thermal change effect between an optical element and the false light diaphragm on the narrow diaphragm edge region remains limited.

Investigations by the inventors have shown that absorption of false light at elements of the holding device can lead to heating, if only slight local heating, in the region of the contact zones in the edge region. Depending on the spatial distribution of the false light, this can lead to an unfavourable asymmetric thermal loading of the optical element, even when the holding elements themselves are distributed regularly or symmetrically over the circumference of the optical element being held.

In some embodiments, the false light diaphragms are fashioned and arranged in such a way that in the case of the optical element all contact zones and all holding elements assigned to the contact zones are screened against radiation running outside the imaging beam path. It is possible in this way to protect the entire mounting technology of the optical element equipped with false light diaphragms against the irradiation of false light.

It is also possible for one or both false light diaphragms to be fashioned and arranged in such a way that in the case of the screened optical element only some of the contact zones and only some of the holding elements assigned to the contact zones are screened against radiation running outside the imaging beam edge. Local heat generation induced by false light can deliberately be allowed in this way in the non-screened regions.

The bilateral protection of an optical element by false light diaphragms at least partially screening the edge region can be provided on one or more optical elements, the optical element in the imaging beam path being arranged so that the imaging beam path between the object plane and image plane leaves only once through the useful region of the optical element (so-called singly transiting optical elements). The bilateral screening of parts or of the entire edge region are particularly useful with so-called doubly transited optical elements. These are understood here as those optical elements through which the radiation running between the object plane and image plane is transmitted in opposite directions in such a way that, for example, a lens surface serves as light entry surface for one partial beam path, and as light exit surface of the optical element for another partial beam path. Since the false light intensity is, as a rule, greater in the region of the light entry side than in the region of the light exit side, a bilateral protection of the two light entry sides is particularly useful here.

For some embodiments, the projection objective has at least one concave mirror and the imaging beam path has a first partial beam path running between the object plane and the concave mirror and a second partial beam path running in between the concave mirror and the image plane, the optical element and the assigned false light diaphragms being arranged in a doubly traversed region in such a way that the first and the second partial beam paths lead through the useful region of the optical element and through the false light diaphragms. A bilateral protection is provided in both transmission directions by the false light diaphragms, with radiation respectively entering on the entry side or typically being screened in a defined way in the edge region.

The screening of false light by a false light diaphragm can take place uniformly over the entire circumference of the edge region. Thus, in the case of the customary round optical parts, a false light diaphragm can, for example, be designed in the manner of a circular diaphragm with a round diaphragm opening in such a way that at least the entire edge region or a radial subregion of the edge region is screened by the false light diaphragm.

False light diaphragms with a circular diaphragm opening can be provided, particularly, in the case of optical elements which are located in the vicinity of a pupil of the optical imaging system, where the cross section of the imaging beam is, as a rule, likewise more or less round. By contrast with an aperture stop which is intended to limit the imaging beam path, thus to block a portion of the imaging beam, in the case of false light diaphragms there is, however, a spacing between rays of the imaging beam running at the edge of the imaging beam path and the inner diaphragm edge, so that a false light diaphragm does not restrict the imaging beam path.

The false light diaphragms of a diaphragm arrangement can be adapted in a different way to the cross-sectional shape of the radiation in the imaging beam path. In some embodiments, the false light diaphragms of a diaphragm arrangement have an, if appropriate, eccentric diaphragm opening whose shape is adapted to the possibly eccentric cross-sectional shape of the beam in the imaging beam path in such a way that a spacing between the diaphragm edge and the beam is less than 2 mm, in particular, less than 1 mm, of at least 80% or even at least 90% of the circumference of the diaphragm opening. The diaphragm opening is adapted in this case to the cross-sectional shape of the footprint of the imaging beam on the screened optical surface of the optical element, allows the entire radiation of the imaging beam path through without hindrance, and screens the regions of the optical useful region which are not used for the imaging, and screens the edge region. An optimum suppression of false light is hereby possible. In order, on the other hand, to avoid an undesired restriction of the imaging beam path, a lateral safety spacing between the diaphragm edge and the beam which is of the order of magnitude of from $\frac{1}{10}$ mm to $\frac{2}{10}$ mm should as far as possible not drop below this magnitude over the entire diaphragm edge.

It is also possible to fashion at least one of the false light diaphragms as a false light diaphragm segmented in a circumferential direction in such a way that the false light diaphragm screens only a part of the circumference of the edge region against radiation running outside the imaging beam path, and other parts of the edge region are exposed to radiation running outside the imaging beam path. In this context, the term "segmented in a circumferential direction" means, among other things, that the spatial effect of a false light diaphragm in a circumferential direction, that is to say in an azimuthal direction, varies in a way which can be described by the shape of the false light diaphragm, and so the screening effect in some circumferential regions is different than in other circumferential regions. A false light diaphragm segmented in a circumferential direction can also be fashioned so that parts of the edge region of the optical element are not screened against false light. This can be utilized, for example, in order to screen against false light respectively only the regions of the contact zones in which the holding elements of the holding device which act on the edge region lie, and to leave unscreened the circumferential regions lying therebetween with which the mounting technology makes no contact.

The radiation running in the imaging beam path is always absorbed to a certain degree by the optical elements in the imaging system, the extent of the absorption can then be, among other things, on the material used for the optical elements, for example on the lens material, the material of a mirror and/or on properties of antireflection coatings normally provided (in the case of lenses or the like) or reflective coatings (in the case of mirrors). This absorption can lead to a heating of the optical elements in the irradiated region, the result being the induction of thermally induced variations in the refracting and/or the reflecting properties of optical elements. This set of problems is frequently subsumed under the term of lens heating. Such instances of local heating can be largely unproblematical when the radiation load and the local heating associated therewith are distributed more or less in a rotationally symmetric fashion relative to the axis of symmetry of an optical element. On the other hand, substantial problems can arise for the imaging quality during operation when an asymmetric, in particular a non-rotationally symmetric radiation load occurs. This asymmetry can be substantial, particularly with catadioptric imaging systems having an off-axis effective object field (off-axis system), particularly with optical elements which are arranged at a relatively large distance from a pupil plane of the optical system or in the optical vicinity of a field plane.

In some embodiments, the optical element is arranged with an asymmetric radiation load inside the optical useful region, and at least one false light diaphragm segmented in a circumferential direction is adapted to a spatial distribution of the radiation load in the optical useful region in such a way that an asymmetry of the radiation load of the optical element is reduced by the radiation falling outside the imaging beam path onto the edge region. It is possible hereby to ensure that the false light falling onto the edge region in the unscreened regions produces a radiation load which induces heat and whose spatial distribution is substantially complementary to the radiation load in the imaging beam path, it thereby being possible to achieve symmetry as regards the radiation load, at least in part. In other words: the negative effects of an asymmetric radiation load in the useful region can be compensated to a certain extent by the false light. The false light can thus be used as a passive manipulator against negative lens heating effects.

The projection objective can be a catadioptric projection objective with at least one concave mirror. It can also be a refractive projection objective, that is to say a projection objective in which all the optical elements with refractive power are transparent to light of the operating wavelength. The operating wavelength can be in the deep ultraviolet region (DUV) at less than 200 nm.

The disclosure relates to a projection exposure machine for exposing a radiation-sensitive substrate which is arranged in the region of an image surface of a projection objective and has at least one image of a pattern of a mask arranged in the region of an object surface of the projection objective, having:
a light source for outputting ultraviolet light;
an illumination system for receiving the light of the light source and for shaping illuminating radiation directed onto the pattern of the mask; and
a projection objective for imaging the structure of the mask onto a light-sensitive substrate;
the projection objective being configured in accordance with the claimed disclosure.

In addition to emerging from the claims, these and further features also emerge from the description and the drawings, it being possible for the individual features to be implemented respectively on their own or severally in the form of subcombinations in an embodiment of the disclosure and in other fields, and to represent advantageous designs which are also patentable per se. Exemplary embodiments of the disclosure are illustrated in the drawings and explained in more detail below.

DETAILED DESCRIPTION OF THE PREFERRED EMBODIMENTS

In the following description of preferred embodiments, the term "optical axis" denotes a straight line or a sequence of straight line sections through the centres of curvature of the optical elements. The optical axis is folded at folding mirrors (deflecting mirrors) or other reflecting surfaces. In the examples, the object is a mask (reticle) with a pattern of an integrated circuit, another pattern also being possible, for example a grating. In the examples, the image is projected onto a wafer which is provided with a photoresist layer and serves as substrate. Other substrates, for example, elements for liquid crystal displays or substrates for optical gratings, are also possible.

Figure 1:
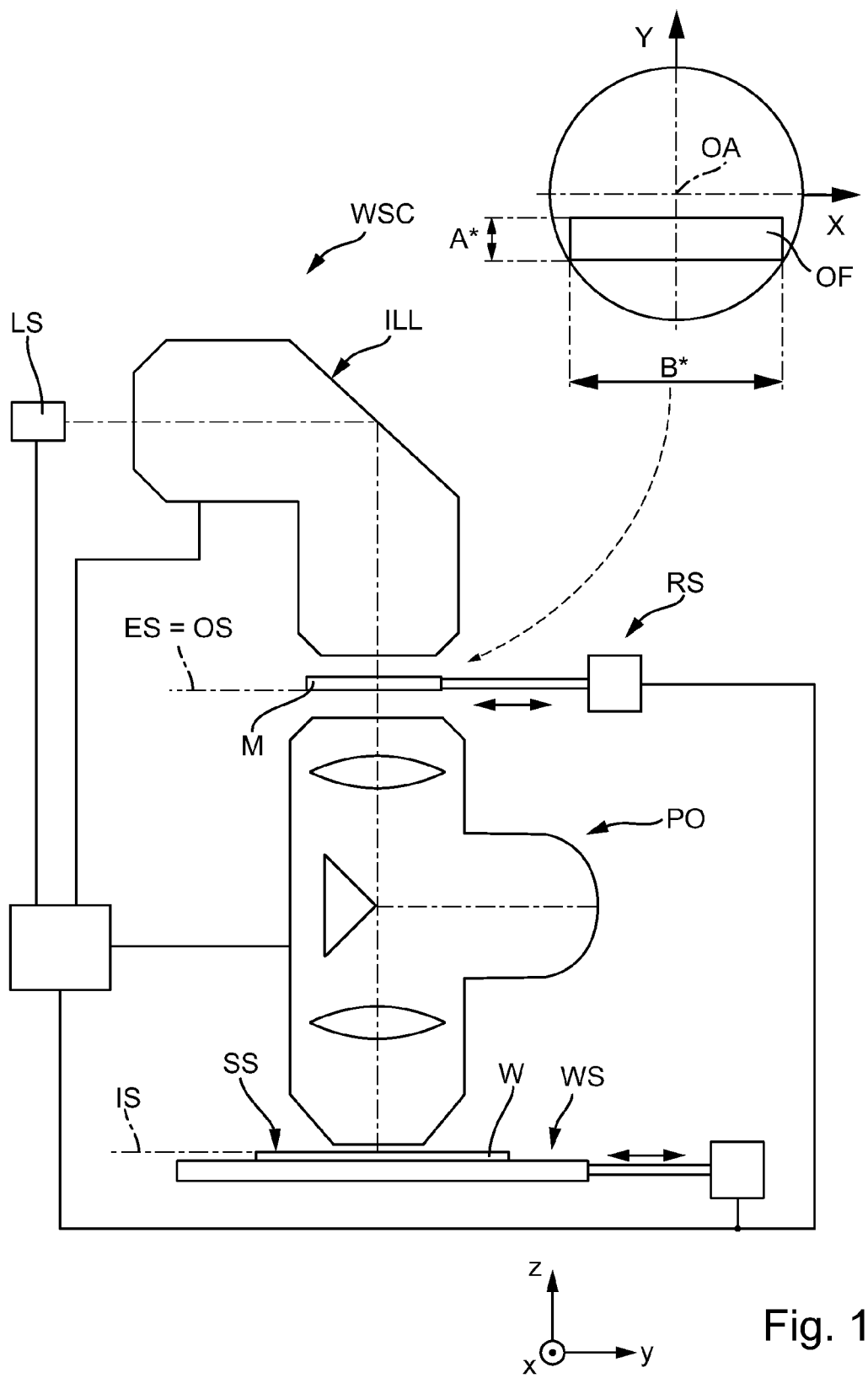
FIG. 1 shows a diagrammatic illustration of a microlithography projection exposure machine.

FIG. 1 shows an example of a microlithography projection exposure machine WSC which can be used in the production of semiconductor components and other finely structured components and which, in order to attain resolutions of up to fractions of micrometers, operates with light or electromagnetic radiation from the deep ultraviolet region (DUV). An ArF excimer laser with an operating wavelength λ of approximately 193 nm serves as primary radiation source or light source LS. Other UV laser light sources, for example can be $F_2$ lasers with an operating wavelength of 157 nm, or ArF excimer lasers with an operating wavelength of 248 nm are likewise possible.

In its exit surface ES, an illuminating system ILL downstream of the light source LS produces a large, sharply limited and substantially homogeneously illuminated illumination field which is adapted to the desired telecentricity properties of the projection objective PO arranged downstream thereof in the light path. The illumination system ILL has devices for setting different illumination modes (illumination settings) and can, for example, be switched over between conventional on-axis illumination with a different degree of coherence σ and off-axis illumination, the off-axis illumination modes including, for example, an annular illumination or a dipole illumination or a quadrupole illumination, or another multipolar illumination. The design of suitable illumination systems is known per se and is therefore not explained here in more detail. Patent application US 2007/0165202 A1 (corresponding to WO 2005/026843 A2) shows examples of illumination systems which can be used in the context of various embodiments.

The illumination system ILL of the projection exposure machine includes those optical components which receive the light of the laser LS and form from the light illumination radiation which is directed onto the reticle M.

In the light path downstream of the illumination system, a device RS for holding and manipulating the mask M (reticle) is arranged so that the pattern arranged on the reticle lies in the object plane OS of the projection objective PO, which coincides with the exit plane ES of the illumination system and is also denoted here as reticle plane OS. For scanner operation in a scanning direction (y-direction), the mask can be moved in this plane in a fashion perpendicular to the optical axis OA (z-direction) with the aid of a scanning drive.

Following downstream of the reticle plane OS is the projection objective PO, which acts as a reduction objective and images an image of the pattern arranged on the mask M to reduced scale, for example, to the scale 1:4 ($|\beta|$=0.25) or 1:5 ($|\beta|$=0.20), onto a substrate W which is coated with a photo-resist layer and whose light-sensitive substrate surface SS lies in the region of the image plane IS of the projection objective PO.

The substrate to be exposed, which is a semiconductor wafer W in the exemplary case, is held by a device WS which includes a scanner drive in order to move the wafer synchronously with the reticle M in a scanning direction (y-direction) perpendicular to the optical axis OA. The device WS, which is also denoted as "wafer stage", and the device RS, which is also denoted as "reticle stage", are components of a scanner device which is controlled by a scanning/control device which is integrated in the case of the embodiment in the central control device CU of the projection exposure machine.

The illumination field produced by the illumination system ILL defines the effective object field OF used in the projection exposure. In the exemplary case, this is rectangular and has a height A*, measured parallel to the scanning direction (y-direction), and a width B*>A* measured perpendicular thereto (in the x-direction). The aspect ratio AR=B*/A* lies as a rule between 2 and 10, in particular between 3 and 6. The effective object field lies next to the optical axis with a spacing in the y-direction (off-axis field). The effective image field in the image surface IS which is optically conjugated with the effective object field, has the same shape and the same aspect ratio between height B and width A as the effective object field, but the absolute field size is reduced however by the imaging scale β of the projection objective, that is to say A=$|\beta|$A* and B=$|\beta|$B*.

Figure 2:
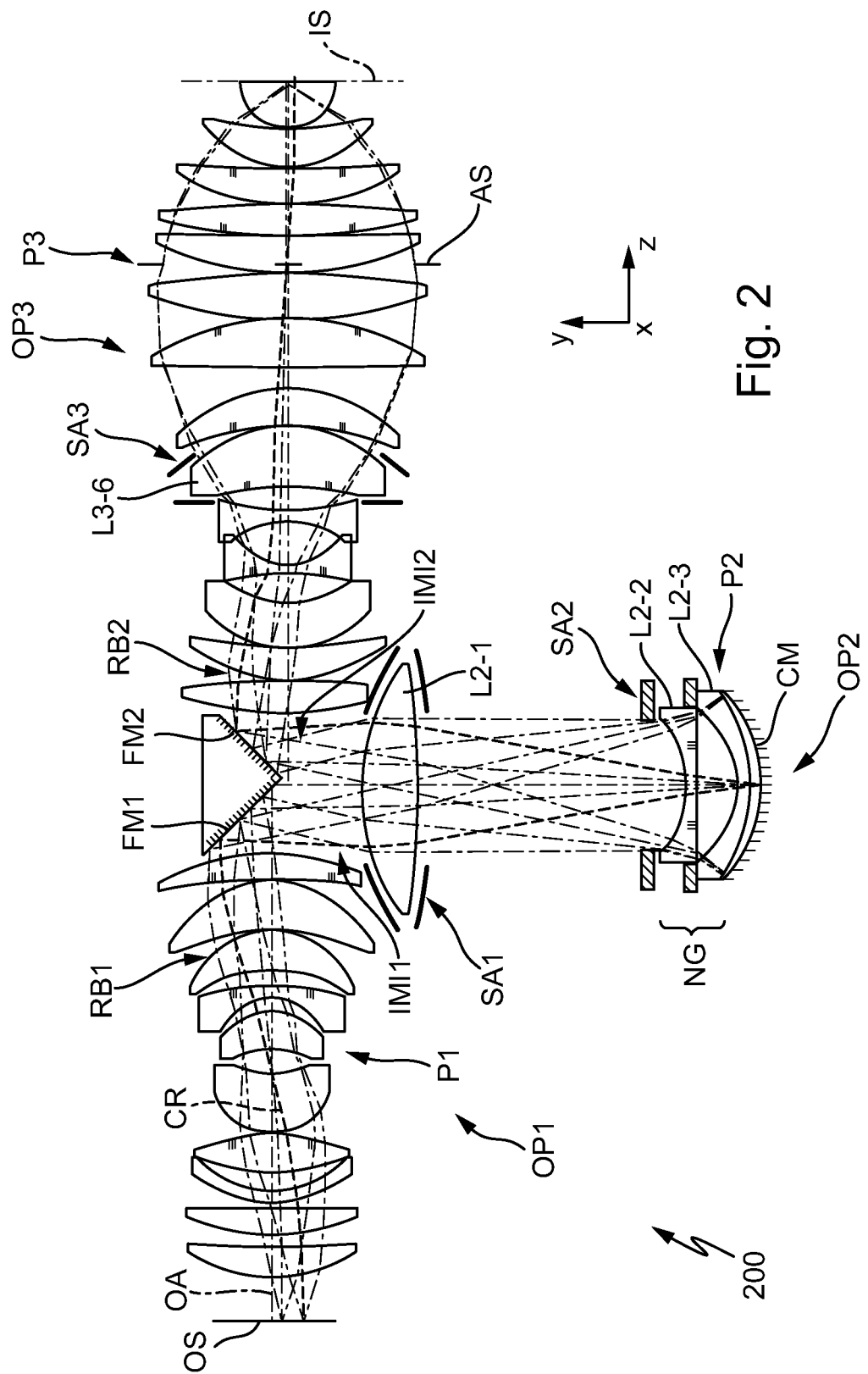
FIG. 2 shows a meridional lens section through a catadioptric projection objective in accordance with an exemplary embodiment.

FIG. 2 shows a diagrammatic meridional lens section of an embodiment of a catadioptric projection objective 200 with selected beams in order to explain the imaging beam path of the projection radiation running through the projection objective during operation. The projection objective is provided as a reducing imaging system for the purpose of imaging a pattern, arranged in its object plane OS of a mask on a reduced scale, for example on the scale 4:1, onto its image plane IS aligned parallel to the object plane. In this case, exactly two real intermediate images IMI1, IMI2 are produced between the object plane and image plane. A first objective part OP1 constructed exclusively with the transparent optical elements and therefore purely refractive (dioptric) objective part OP1 is designed so that the pattern of the object plane is imaged into the first intermediate image IMI1 substantially without a change in size. A second, catadioptric objective part OP2 images the first intermediate image IMI1 onto the second intermediate image IMI2 substantially without a change in size. A third, purely refractive objective part OP3 is designed to image the second intermediate image IMI2 into the image plane IS with a stronger reduction.

Between the object plane and the first intermediate image, between the first and the second intermediate image, as well as between the second intermediate image and the image plane pupil surfaces P1, P2, P3 of the imaging system respectively lie where the principal ray CR of the optical image intersects the optical axis OA. The aperture stop AS of the system is fitted in the region of the pupil surface P3 of the third objective part OP3. The pupil surface P2 inside the catadioptric second objective part OP2 lies in the immediate vicinity of a concave mirror CM.

If the projection objective is designed and operated as an immersion objective, during operation of the projection objective radiation is transmitted through a thin layer of an immersion liquid which is located between the exit surface of the projection objective and the image plane IS. Immersion objectives with a comparable basic design are shown, for example in the international patent application WO 2004/

019128 A2. Image-side numerical apertures NA>1 are possible during the immersion operation. A configuration as dry objective is also possible; here, the image side numerical aperture is limited to values NA<1.

The catadioptric second objective part OP2 includes the single concave mirror CM of the projection objective. Located directly upstream of the concave mirror is a negative group NG with two negative lenses L2-2 and L2-3. In this arrangement, occasionally denoted as a Schupmann Achromat, the Petzval correction, that is to say the correction of the image field curvature, is yielded by the curvature of the concave mirror and the negative lenses in the vicinity thereof, while the chromatic correction is yielded by the refractive power of the negative lenses upstream of the concave mirror and the positioning of the diaphragm with respect to the concave mirror.

A reflective deflecting device serves the purpose of separating the beam running from the object plane OS to the concave mirror CM, or the corresponding partial beam path RB1 from that beam or partial beam path RB2 which, after reflection at the concave mirror, runs between the latter and the image plane IS. To this end, the deflecting device has a flat first deflecting mirror FM1 for reflecting the radiation coming from the object plane to the concave mirror CM, and a second deflecting mirror FM2 which is aligned at a right angle to the first deflecting mirror FM1 and deflects the radiation reflected by the concave mirror in the direction of the image plane IS. Since the optical axis is folded at the deflecting mirrors, the deflecting mirrors are also denoted as folding mirrors in this application. In relation to the optical axis OA of the projection objective, the deflecting mirrors are tilted, for example by 45°, about tilt axes running perpendicular to the optical axis and parallel to a first direction (x-direction). In one design of the projection objective for scanning operation, the first direction (x-direction) is perpendicular to the scanning direction (y-direction) and therefore perpendicular to the direction of movement of the mask (reticle) and substrate (wafer). To this end, the deflecting device is implemented by a prism whose externally silvered short faces, aligned perpendicular to one another, serve as deflecting mirrors.

The intermediate images IMI1, IMI2 lie in the optical vicinity of the folding mirrors FM1 and FM2, respectively, lying closest to them, but are at a minimum optical distance therefrom so that possible errors on the mirror surfaces are not sharply imaged into the image plane, and the flat deflecting mirrors (plane mirrors) FM1, FM2 lie in the region of moderate radiation energy density.

The positions of the (paraxial) intermediate images define field planes of the system which are optically conjugate with the object plane and the image plane respectively. The deflecting mirrors therefore lie in the optical vicinity of field planes of the system, and this is also denoted as "near-field" within the scope of this application. Here, the first deflecting mirror is arranged in the optical vicinity of a first field plane belonging to the first intermediate image IMI1, and the second projecting mirror is arranged in the optical vicinity of a second field plane, which is optically conjugate with a first field plane and belongs to the second intermediate image IMI2.

The optical vicinity or the optical distance of an optical surface relative to a reference plane (for example a field plane or a pupil plane) is described in this application by the so-called subaperture ratio SAR. The subaperture ratio SAR of an optical surface is defined as follows for the purposes of this application:

$$SAR = \text{sign } h(r/(|h|+|r|)),$$

r denoting the marginal ray height, h the principal ray height, and the sign function sign x the sign of x, where by convention it holds that sign 0=1. The principle ray height is understood as the ray height of the principle ray of a field point of the object field with a maximum field height in absolute terms. The ray height is to be understood here as having a sign. The marginal ray height is understood as the ray height of a ray with maximum aperture emanating from the point of intersection of the optical axis with the object plane. This field point need not contribute to the transmission of the pattern arranged in the object plane—particularly in the case of off-axis image fields.

The subaperture ratio is a variable which has a sign and is a measure of the vicinity of a plane in the beam path to the field or pupil. By definition the subaperture ratio is standardized to values of between −1 and +1, the subaperture ratio being zero in each field plane, and the subaperture ratio jumping from −1 to +1, or vice versa, in a pupil plane. A subaperture ratio of 1 in absolute terms therefore determines a pupil plane.

Near-field planes therefore have subaperture ratios which lie near 0, while pupil near planes have subaperture ratios which lie near 1 in absolute terms. The sign of the subaperture ratio specifies the position of the plane upstream or downstream of a reference plane.

It holds for both deflecting mirrors that the optical element is arranged between the deflecting mirror and the intermediate image lying nearest (immediate vicinity) and that the subaperture ratio SAR is smaller in absolute terms than 0.3, in particular smaller than 0.2. It holds that SAR=+0.137 for FM1, and that SAR=−0.040 for FM2.

A particular feature of the system consists in that there is provided geometrically between the folding mirrors FM1, FM2 and the concave mirror CM in a region of the projection objective through which radiation can be doubly transmitted a biconvex positive lens L2-1 which is used in two opposite transit directions and to which radiation is transmitted in mutually offset lens regions both in the first partial beam path between the object plane OS or the first intermediate image IMI1 and the concave mirror CM, and in the second partial beam path between the concave mirror and the second intermediate image IMI2 or the image plane IS. The positive lens L2-1 is arranged nearer to the folding mirrors FM1, FM2 than to the concave mirror CM, in particular in the first third of the axial spacing between the folding mirrors and the concave mirror. The positive lens L2-1 is arranged in a near-field fashion both with reference to the first intermediate image IMI1 and with reference to the second intermediate image IMI2, and therefore acts as a field lens with reference to the two intermediate images. During the first transit in the light path between the object plane and concave mirror, the subaperture ratio on the surface L2-1-1 facing the deflecting mirrors is SAR=−0.175, and on the other surface SAR=−0.249. During the second transit in the light path between the concave mirror and image plane, it holds that SAR=+0.254 on the light entrance surface L2-1-2 facing the concave mirror, and that SAR=0.180 on the light exit surface facing the deflecting mirrors. Thus, in each case, the subaperture ratio on the lens surfaces is smaller than 0.3 in absolute terms.

In the light path between the first intermediate image IMI1 and the concave mirror CM, the effect of refractive power is, among other things, that the diameters of the subsequent lenses L2-2 and L2-3 of a negative group NG arranged immediately upstream of the concave mirror, and the diameter of the concave mirror CM can be kept small. In the light path from the concave mirror to the second intermediate image IMI2 and to the image plane, the positive refractive power effects a reduction in the incidence angle bandwidth of the radiation also impinging on the second folding mirror FM2, which can therefore be coated with advantageous reflective layers. Moreover, the field lens acts advantageously for the limitation of the lens diameters in the refractive third objective part OP3 which is nearest the image field and is substantially responsible for the production of the high image-side numerical aperture (NA=1.30) of the immersion projection objective.

Further advantages and options for the configuration of such positive field lenses are described in the international patent application with publication number WO 2005/111689 A2 of the Applicant. The optical design of the exemplary embodiment of FIG. 2 corresponds to that of the exemplary embodiment shown in FIG. 11 of WO 2005/111689 A2. The content of WO 2005/111689 A2 is to this extent incorporated by reference in this description.

Figure 3A:
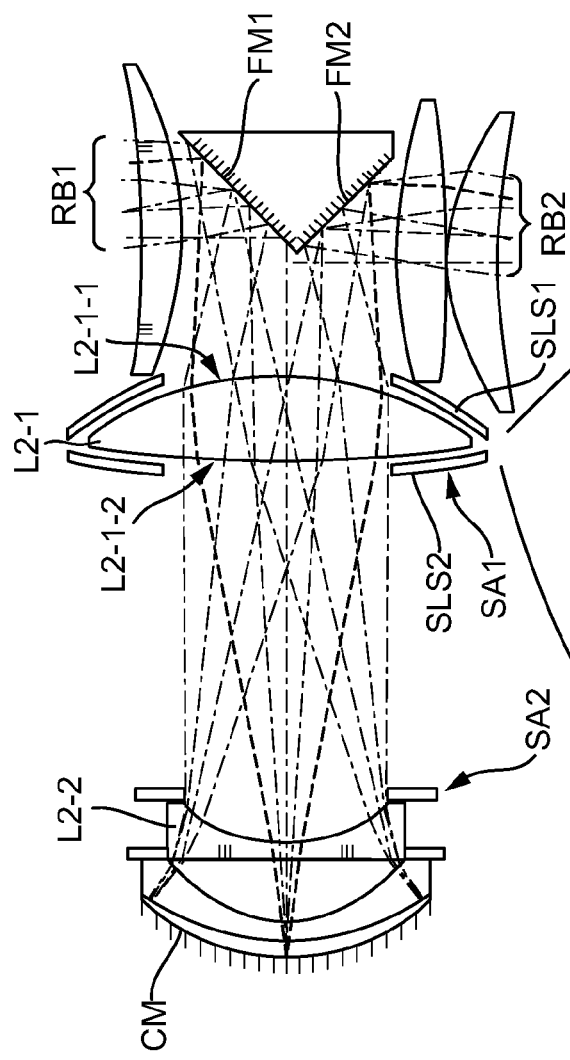
FIG. 3A shows an enlarged detail of the second objective part of the exemplary embodiment shown in FIG. 2 with a doubly traversed, near-field positive lens with false light diaphragms on two sides.
Figure 3B:
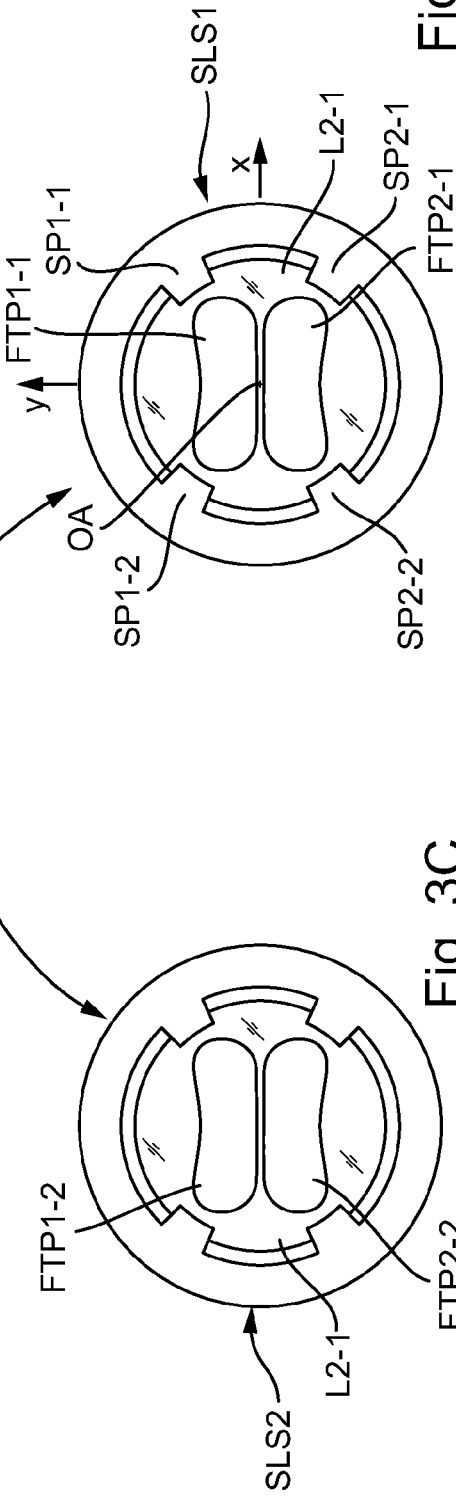
FIGS. 3B and 3C show axial top views of two sides of the positive lens of FIG. 3A, with a false light diaphragm placed upstream, in each case.
Figure 3C:
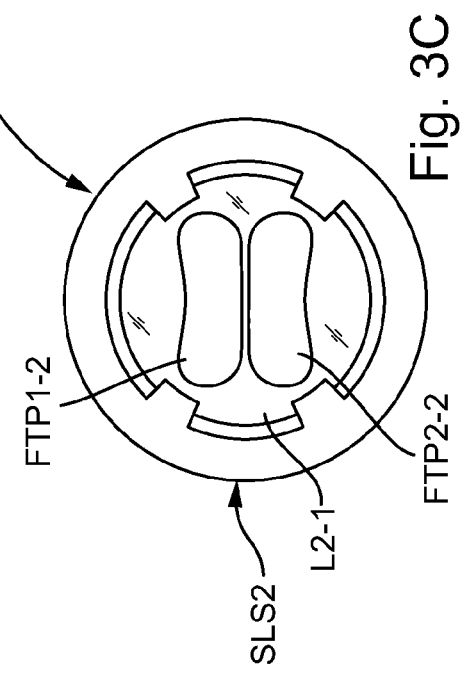

During operation of the projection objective, the positive lens arranged in a near-field position is exposed, owing to the radiation propagating in the imaging beam path, to a non-rotationally symmetric radiation load which can lead to non-rotationally symmetric lens heating effects. For the purpose of explanation, FIG. 3B shows a top view, directed parallel to the optical axis, of the aspherically curved lens surface L2-1-1 facing the deflecting mirrors FM1, FM2, and FIG. 3C shows a corresponding axial top view of the aspherically curved lens surface L2-1-2 facing the concave mirror CM. So-called footprints FTP1-1 and FTP2-1 (for the aspheric lens surface) and, respectively FTP1-2 and FTP2-2 for the spherical lens surface are respectively illustrated on the lens surfaces. The footprints correspond in each case to the region within the optical useful region which is illuminated overall by the projection beam. In the diagrammatic illustration, the footprints are shown approximately as rectangular with rounded corners. This illustrates that the cross section of the projection beam at the location of the lens surfaces corresponds approximately to the rectangular shape of the effective object field because the lenses are near field (small sub-aperture ratio). The rounded corners of the footprints illustrate that the rectangular shape deviates from the exact rectangular shape because of the optical spacing of the lens surfaces relative to the position of the nearest field plane (that is to say the nearest intermediate images). It may be mentioned further that in the projection objective illustrated the cross section of the projection beam is substantially circular on an optical surface lying in the vicinity of a pupil surface.

The footprints FTP1-1 and FTP1-2 respectively shown above the x-z-plane belong respectively to the first partial beam path RB1 which runs from the object plane in the direction of the concave mirror and in which the aspheric lens surface L2-1-1 serves as light entry surface, and the spherical lens surface L2-1-2 serves as light exit surface. The footprints FTP2-1 and FTP2-2 respectively lying below the x-z plane belong, by contrast, to the second partial beam path RB2 between the concave mirror and image surface, the spherical lens surface L2-1-2 here serving as light entry surface, and the aspheric lens surface L2-1-1 serving as light exit surface.

Owing to the fact that the second objective part OP2 has an imaging scale of −1:1, at least approximately, the footprints lying on both sides of the x-z-plane are respectively substantially equal in size and very similarly shaped, although arranged in mirror-image fashion relative to the x-z-plane. The overall result is therefore a non-rotationally symmetric radiation load which is approximately mirror-symmetric relative to the x-z-plane, although it does not exhibit rotational symmetry with reference to the optical axis OA. It is striking, in particular, that the radiation load along the x-direction reaches nearer to the edge region than in the y-direction perpendicular thereto. The zones of the edge region which lie in the x-direction therefore tend to be heated more strongly than the zones lying in the y-direction, which have a larger radial spacing from the illuminated regions.

Possible negative effects of this non-rotationally symmetric radiation load on the imaging quality are compensated at least partially in the exemplary embodiment with the aid of a first diaphragm arrangement SA1 which has a pair of false light diaphragms SLS1, SLS2 segmented in a circumferential direction. The screening effect of the diaphragms is adapted to the spatial distribution of the radiation load in the optical useful region (that is to say in the region of the footprints) so that the irradiation of false light onto certain segments of the edge region of the lens is permitted in a targeted fashion so that the false light can likewise slightly heat the lens material in the regions irradiated by false light, and thus can at least partially compensate the asymmetric lens deformation caused by the projection beam. To this end, a first false light diaphragm SLS1 is fitted directly upstream of the aspheric lens surface L2-1-1 of the positive lens, that is to say geometrically between the latter and the folding mirrors, and there is fitted in the immediate vicinity of the opposite spherical lens surface L2-1-2 a second false light diaphragm SLS2, which respectively screen a part of the edge region of the lens in certain azimuthal regions, but leave other azimuthal regions free. With reference to the first partial beam path RB1, the first false light diaphragm SLS1 is located upstream of the lens, and the second false light diaphragm SLS2 is located downstream. The roles are reversed with reference to the second partial beam path RB2 running between the concave mirror and image surface, the second false light diaphragm SLS2 then being arranged here directly upstream of the positive lens L2-1, and the first false light diaphragm SLS1 being arranged directly downstream thereof.

Figure 6:
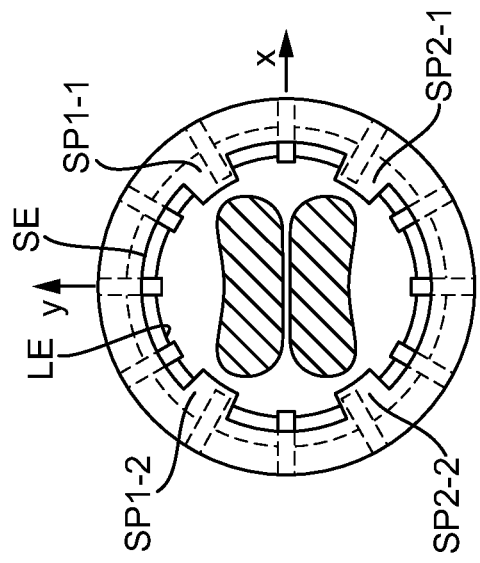

The geometrical shape of a false light diaphragm is explained in more detail with the aid of FIG. 3B for the first false light diaphragm SLS1 facing the deflecting mirrors FM1, FM2 (compare also FIG. 6). The false light diaphragm has an outer ring section which lies completely outside the lens in a radial direction. At four regions offset from one another, in a circumferential direction, rectangular screening sections SP 1-1 and SP 1-2 and SP2-1 and SP2-2 respectively project radially inwards along the edge region of the lens and cover a circumferential section of the edge region over a certain circumferential angle of, for example, 10 to 20°. The diaphragm diameter is therefore smaller than the lens diameter in these azimuthal regions. The screen sections respectively project inwards in the direction of the optical axis at those circumferential locations at which the outer corners of the footprints reach particularly far in the direction of the edge region of the lens, that is to say where the thermal load is large relative to other circumferential sections even in the direction of the edge region of the lens. The overall result is a mirror symmetry relative to the x-z-plane, but no rotational symmetry. In the intermediate regions lying symmetrically to the y-direction, which respectively have a circumferential width of approximately 90°, no screening of the edge region takes place, and so here false light can shine without screening as far as to the edge of the lens. The same holds for the circumferential sections that lie symmetrically relative to in the x-direction, which respectively have a circumferential width of approximately 45°. In the regions not screened, heating of the lens through false light can take place in such a way that the thermal load of the entire lens is less non-uniform than in the case of a thermal load solely due to useful radiation present in the projection beam (compare footprints). This leads to a certain degree of symmetry in the thermal radiation load, and thus to a reduction in aberrations caused thereby.

An appropriate shaping of the second false light diaphragm SLS2 lying between the positive lens L2-1 and the concave mirror ensures a corresponding screen, segmented in a circumferential direction, of sides of the concave mirror. It is hereby possible to partially screen firstly over-aperatured light which tends to pass to the positive lens from sides of the concave mirror, on the one hand, and also to partially screen radiation not belonging to the imaging beam path and reflected by the concave mirror.

A diaphragm arrangement having a first false light diaphragm fitted upstream of an optical element and a second false light diaphragm fitted directly downstream of the optical element can alternatively or in addition also be provided in the case of one or more other lenses of the projection objective. In the exemplary case, such a bilaterally effective second diaphragm arrangement SA2 is also assigned to the negative lens L2-2 of the negative group NG, which negative lens is arranged in the two-fold beam transit between the deflecting mirrors and the concave mirror. Because of the nearness of this negative lens to the second pupil plane P2 at the concave mirror CM, the projection beam has a largely circular cross section here. The two false light diaphragms are correspondingly equipped with a circular diaphragm opening, that is to say are not segmented in the circumferential direction (compare FIG. 5). It is thereby possible for the optically unused edge region of this lens to be screened completely on both sides against the effect of false light.

A third diaphragm arrangement SA3 is to be provided in the exemplary embodiment inside the third objective part OP3 in the region of a single beam transit in order to screen the edge region of the positive meniscus lens L3-6, which is convex relative to the image plane, uniformly against false light, over the entire circumference both upstream and downstream of the lens. From an optical point of view, the positive lens L3-6 lies in an intermediate region between the second intermediate image IMI2 (subaperture ratio SAR=0) and the following third pupil plane P3, in the case of which the subaperture ratio SAR=1 and the diameter of the projection beam is substantially circular.

It may further be mentioned here that the false light diaphragms described are provided in addition to the aperture diaphragm AS of the projection objective, which is arranged in the region of the third pupil surface P3, and—unlike the aperture stop—do not serve to limit the cross section of the projection beam. In the example, the aperture stop AS is configured as a variable diaphragm with a circular diaphragm opening in order to set the image-side numerical aperture actually used for a projection operation by varying the diameter of the diaphragm opening. Such an aperture stop thus limits the imaging beam path, while the false light diaphragms do not reach into the imaging beam path and therefore do not block the component of the radiation desired for imaging. As a rule, the false light diaphragms are designed as simple, non-variable diaphragms with invariable diaphragm geometry. Individual false light diaphragms can, however, also be designed as variable diaphragms if desired.

In the exemplary cases, the false light diaphragms are components separated from the lenses in each case, and which consist, for example, of a metallic material and can, if appropriate, be coated with optically active coatings. It is also possible in exceptional cases to implement a false light diaphragm by a coating, for example a reflecting one, of the edge region in a lens.

Figure 4:
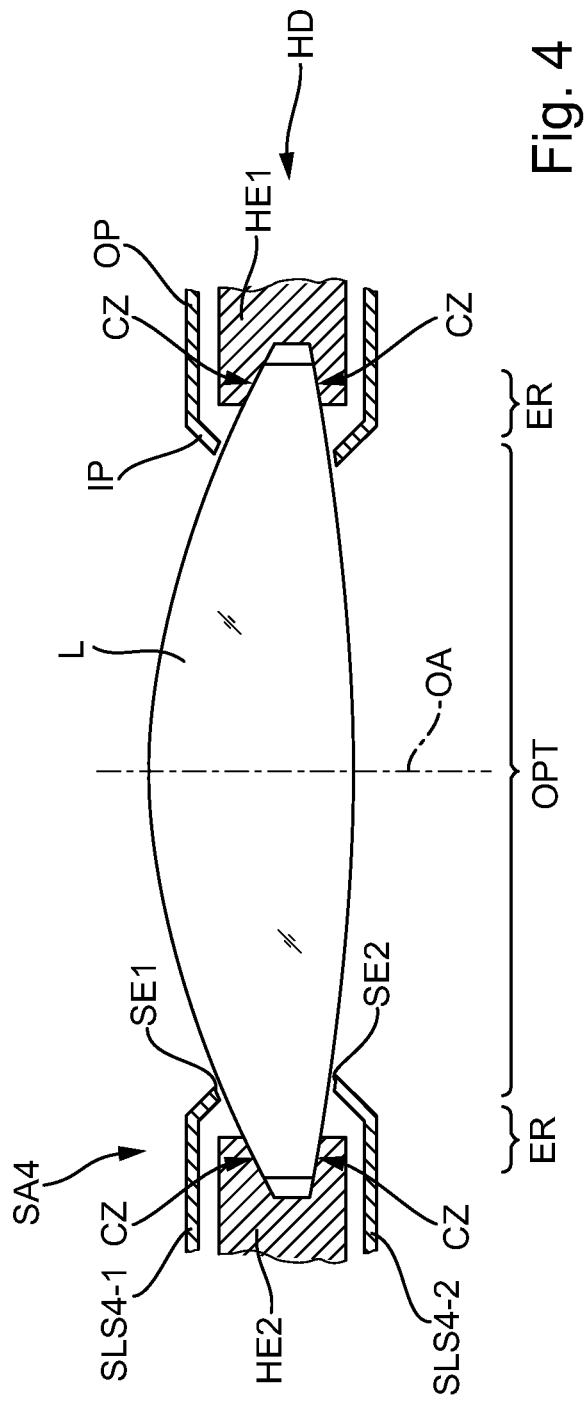
FIG. 4 shows an axially parallel section through a biconvex lens which is held in the edge region by a holding device, the edge region and the holding device being screened against false light by false light diaphragms of a diaphragm arrangement.

Further details relating to the design and function of a diaphragm arrangement SA4 are explained with the aid of FIG. 4, which shows an axial section along a section plane, containing the optical axis OA, through a biconvex positive lens L which can be the field lens L2-1 of the above-described projection objective or a lens installed at another location. The lens is held in its position by an essentially annular holding device HD (illustrated only diagrammatically). The holding device has a plurality of holding elements HE1, HE2 which are distributed uniformly over the circumference of the lens, act on the circular, annular edge region ER of the lens and are in contact with the edge region in the region of contact zones CZ. Lying around the optical axis OA is the optical useful region OPT of the lens surfaces, which has been processed in each case with optical quality by polishing and/or ion beam processing and/or in some other way. This optical quality need not be achieved at the edge region ER.

In the case of an example of a lens installed with a horizontal optical axis, the holding elements act both on the front side and the rear side of the lens. By way of example, the lens can be fixed in the holding device in the regions of the contact zones by clamping (for example in accordance with US 2003/0234918 A1) or by bonding via bonding layers (compare, for example, U.S. Pat. No. 6,097,536 or U.S. Pat. No. 7,081,278). The disclosure of these documents with respect to the fixing of the holding elements on the lens is incorporated in this description by reference. Alternatively or in addition, it is also possible to make use of other fixing techniques which ensure, for example, by bonding and/or form closure and/or force closure, that a relative movement between the holding element and the optical element is prevented. A unilateral holding and fixing on the underside can suffice in the case of lenses which are installed with a vertical optical axis.

The lens is assigned a diaphragm arrangement SA4 with a first false light diaphragm SLS4-1 arranged directly upstream of the lens, and a second false light diaphragm SLS4-2 arranged directly downstream of the lens in a way similar to that already described above in conjunction with FIGS. 2 and 3. The false light diaphragms respectively shaped so that they screen the opposite holding elements HE1 and HE2 shown completely against false light and project inwards over the region of the respective contact zones so that the inner diaphragm edge SE1 or SE2 respectively, of the false light diaphragms lies nearer the optical axis in the region of these holding elements than the contact zone. The false light diaphragms respectively have an outer, flat, substantially annular outer section OP which is substantially aligned in a plane perpendicular to the optical axis OA, and an inner section IP, which connects inwardly, is in the shape of a conical frustum, for example, and is aligned obliquely in relation to the optical axis in a relatively steep fashion in the direction of the lens surface respectively to be screened. As a result, the diaphragm edge SE1 or SE2 respectively lies very near the lens surface to be screened, but at the same time enough space remains further out between the false light diaphragm and the protected lens surface in order to accommodate parts of the mounting technology, in particular the holding elements. The spacing from the lens surface measured parallel to the optical axis can lie in the region of the diaphragm edge at much less than 1 millimetre, for example, at approximately 0.1 mm. A sharp-edged screening is thereby achieved. However, the spacing is finite and so physical contact is reliably avoided. The holding device is screened by the false light diaphragms on its axial sides and on its inner side facing the optical axis by the respective false light diaphragm and so, in practice, no false light can pass to the holding elements.

It may further be explained with the aid of FIG. 6 that there is also the possibility of fashioning a false light diaphragm such that some of the holding elements are deliberately exposed to the false light in the region of the contact zone, that is to say are not screened.

Figure 7:
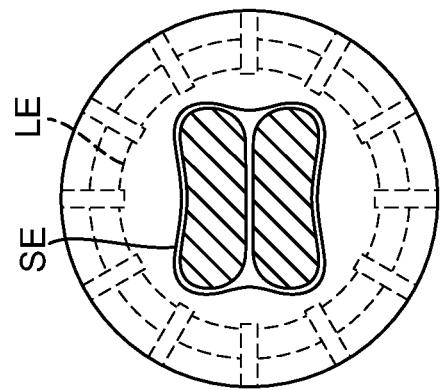
FIGS. 5-7 show diagrammatic illustrations of different types of false light diaphragms, for diaphragm arrangements in accordance with various embodiments.
Figure 5:
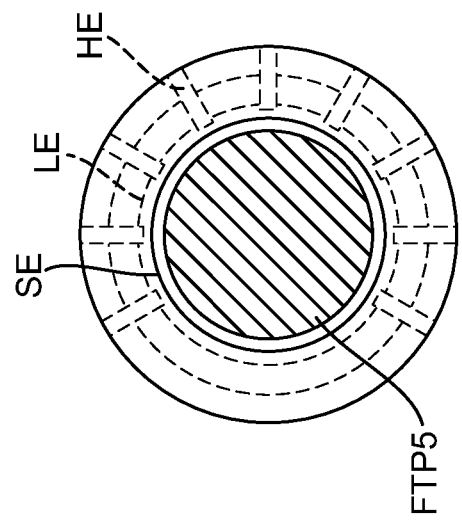

Different diaphragm geometries are explained by way of example with the aid of FIGS. 5, 6 and 7, which respectively show axial views of a side of a lens provided with a diaphragm arrangement. The reference symbol SE stands, in each case, for the inner diaphragm edge of a false light diaphragm, the edge being illustrated by a continuous line. The reference symbol LE stands in each case for the outer lens edge of the lens, which is illustrated by dashes, when it is covered by the false light diaphragm in the axial view, and by a continuous line when the lens edge lies radially inside the diaphragm edge and is therefore exposed to the false light. The reference symbol HE stands in general for the holding element of the holding device, which element is in contact with the edge region of the respective lens. These are drawn with dashes in each case when they are covered by the false light diaphragm and therefore screened. Wherever parts of the holding elements are not screened and are therefore exposed to the false light, the holding elements are illustrated by continuous lines. The hatched surfaces on the lens surfaces in each case represent the footprint or the footprints of the projection beam on the respectively visible lens surface. The outer edge of these surfaces thus represents the lateral edge of the imaging beam on the corresponding lens surface.

FIG. 5 shows an example of a circular diaphragm, that is to say a false light diaphragm with a circular diaphragm opening. The false light diaphragm is provided on a lens fitted in the vicinity of a pupil plane, something which can be detected from the more or less circular cross section of the footprint FTP5. Over the entire circumference of the lens, the false light diaphragm covers all the holding elements and the entire edge region of the lens and leaves free a circular section of the optical useful region which is somewhat larger than the cross section of the projection beam. The radial spacing between the projection beam and the diaphragm edge is here between 0.1 mm and 1 mm over the entire circumference. The false light diaphragm does not limit the cross section of the projection beam, but protects the entire mounting technology including the inwardly projecting holding elements and the contact zones upstream of the false light irradiation. By way of example, in the exemplary embodiment of FIGS. 2 and 3, the false light diaphragms of the second diaphragm arrangement SA2 can be configured around the negative lens L2-2 as circular diaphragms.

FIG. 6 shows a false light diaphragm, already shown in FIG. 3B, of the first diaphragm arrangement SA1, it being possible here, however, to detect the screening of the holding elements more effectively. In the region of the inwardly projecting screen sections SP1-2 to SP2-2, not only is the edge region of the lens completely screened, so too are the holding elements acting thereon. Thus, no local production of heat induced by false light irradiation can occur here. By contrast, the holding elements opposite one another in the x-direction are only partially covered, and so the radially inwardly lying ends of the holding elements lie inside the diaphragm opening and are therefore exposed to the irradiation of false light. The same holds for the groups of respectively three neighbouring holding elements that lie opposite one another in the y-direction. The heat possibly produced in the region of the unscreened contact zones is distributed spatially such that an asymmetry of the thermal load of the lens which is generated in the region of the footprints is reduced, and results to a certain extent in a more uniform thermal loading of the lens.

FIG. 7 shows an example of a so-called "footprint diaphragm", which is distinguished by the fact that the course of the out-of-round inner diaphragm edge SE is located over the greatest part of the circumference of the diaphragm opening at a more or less uniform spacing (typical values of between approximately 0.1 mm and 1 mm) from the nearest edge of the projection beam (detectable from the footprint) so that what in essence remains unscreened is only that subregion of the optical useful region which is actually used for transmission by the projection beam. The entire holding device including all the holding elements lies in the screened region and is therefore not exposed to the false light in practice. An appropriately shaped footprint diaphragm is located on the opposite side. The false light diaphragms of the third diaphragm arrangement SA3, which are arranged around a singly irradiated lens arranged neither in a particularly near-field nor in a particularly near-pupil fashion, can be fashioned as footprint diaphragms, for example.

What is claimed is:

1. A projection objective configured to image an object in an object plane into an image of the object in an image plane along an imaging beam path, the projection objective comprising:
   a multiplicity of transparent optical elements including a first transparent optical element;
   a multiplicity of holding devices including a first holding device, the multiplicity of holding devices being configured to hold the multiplicity of transparent optical elements at positions along the imaging beam path;
   a first false light diaphragm; and
   a second false light diaphragm,
   wherein:
      the first transparent optical element has an optical useful region in the imaging beam path and an edge region outside the optical useful region;
      a holding element of the first holding device acts on the first transparent optical element at the edge region;
      the first false light diaphragm is directly upstream of the first transparent optical element along the imaging beam path;
      the second false light diaphragm is directly downstream of the first transparent optical element; and
      the first and second false light diaphragms are configured so that the first and second false light diaphragms screen at least a part of the edge region against radiation outside the imaging beam path during use of the projection objective.

2. The projection objective of claim 1, wherein:
   one of the first and second false light diaphragms has an inner diaphragm edge defining a diaphragm opening; and
   a spacing between the inner diaphragm edge and the optical useful region of the first transparent optical element is less than 2 mm over an entire circumference of the inner diaphragm edge.

3. The projection objective of claim 2, wherein the spacing between the inner diaphragm edge and the optical useful region of the first transparent optical element is $\frac{1}{10}$ mm or more.

4. The projection objective of claim 1, wherein one of the first and second false light diaphragms has a flat outer edge section to which there is connected an inner section which runs obliquely relative to the first transparent optical element.

5. The projection objective of claim 1, wherein the inner section is conically shaped.

6. The projection objective of claim 1, wherein the first and second false light diaphragms are configured so that all holding elements assigned to the first transparent optical element are screened against radiation outside the imaging beam path during use of the projection objective.

7. The projection objective of claim 1, wherein the first and second false light diaphragms are configured so that, for the first transparent optical element, only some of the holding elements assigned to the first transparent optical element are screened against radiation outside the imaging beam edge during use of the projection objective.

8. The projection objective of claim 7, wherein the first and second false light diaphragms are configured so that, for the first transparent optical element, only some contact zones for holding elements assigned to the first transparent optical element are screened against radiation outside the imaging beam edge during use of the projection objective.

9. The projection objective of claim 1, wherein the first and second false light diaphragms are configured so that, for the first transparent optical element, only some contact zones for holding elements assigned to the first transparent optical element are screened against radiation outside the imaging beam edge during use of the projection objective.

10. The projection objective of claim 1, wherein:
each of the first and second false light diaphragms has a circular diaphragm opening; and
during use of the projection objective, there is a spacing between rays of the imaging beam at an edge of the imaging beam path and an inner diaphragm edge of each of the first and second false light diaphragms so that the first and second false light diaphragms do not restrict the imaging beam path.

11. The projection objective of claim 10, wherein the first transparent optical element is in a pupil of the projection objective or is in a vicinity of a pupil of the projection objective.

12. The projection objective of claim 1, wherein each of the first and second false light diaphragms has a diaphragm opening whose shape is adapted to a cross sectional shape of the imaging beam in the imaging beam path so that a spacing between a diaphragm edge and the beam is at most 2 mm over at least 80% of a circumference of the diaphragm opening.

13. The projection objective of claim 1, wherein:
the projection objective has a concave mirror;
the imaging beam path has a first partial beam path between the object plane and the concave mirror;
the imaging beam path has a second partial beam path between the concave mirror and the image plane; and
the first transparent optical element and the first and second false light diaphragms are arranged in a doubly traversed region so that the first and the second partial beam paths lead through the useful region of the first transparent optical element and through the first and second false light diaphragms.

14. The projection objective of claim 1, wherein at least one of the first and second false light diaphragms is segmented in a circumferential direction so that the false light diaphragm screens only a part of an edge region the false light diaphragm against radiation outside the imaging beam path, and so that another part of the edge region of the false light diaphragm is exposed to radiation outside the imaging beam path.

15. The projection objective of claim 1, wherein:
the first transparent optical element is in a region with a non-rotationally symmetric radiation load inside the optical useful region; and
at least one of the first and second false light diaphragms is segmented in a circumferential direction and adapted to a spatial distribution of the radiation load in the optical useful region so that an asymmetry of the radiation load of the first transparent optical element is reduced by the radiation outside the imaging beam path onto the edge region.

16. The projection objective of claim 1, wherein the first transparent optical element is provided with a diaphragm arrangement arranged optically in a vicinity of a field plane where the absolute value of a sub-aperture ratio is smaller than 0.3 for all optical surfaces of the first transparent optical element.

17. The projection objective of claim 1, wherein:
the projection objective comprises a first objective part configured to image an object field in a first real intermediate image;
the projection objective comprises a second objective part configured to produce a second real intermediate image with the radiation coming from the first objective part; and
the projection objective comprises a third objective part configured to image the second real intermediate image in the image plane;
the second objective part is a catadioptric objective part with a concave mirror;
the projection objective comprises a first folding mirror to reflect the radiation coming from the object plane in the direction of the concave mirror;
the projection objective comprises a second folding mirror is provided to reflect the radiation coming from the concave mirror in the direction of the image plane; and
the first transparent optical element is in a doubly traversed region between the concave mirror and the folding mirrors.

18. The projection objective of claim 17, comprising a field lens of positive refractive power between the first intermediate image and the concave mirror in a near-field region of the first intermediate image, wherein the field lens is assigned a diaphragm arrangement.

19. The projection objective of claim 1, comprising first and second diaphragm arrangements.

20. A projection exposure machine, comprising:
an illumination system; and
the projection objective of claim 1,
wherein the projection exposure machine is a microlithography projection exposure machine.

* * * * *

UNITED STATES PATENT AND TRADEMARK OFFICE
CERTIFICATE OF CORRECTION

PATENT NO.       : 8,488,104 B2
APPLICATION NO.  : 13/107011
DATED            : July 16, 2013
INVENTOR(S)      : Nils Dieckmann et al.

Page 1 of 1

It is certified that error appears in the above-identified patent and that said Letters Patent is hereby corrected as shown below:

In the Specification

Col. 4, line 39, delete "that that" and insert -- that --.

Signed and Sealed this
First Day of October, 2013

Teresa Stanek Rea
*Deputy Director of the United States Patent and Trademark Office*